United States Patent
Ishibashi et al.

(10) Patent No.: US 6,281,522 B1
(45) Date of Patent: *Aug. 28, 2001

(54) METHOD OF MANUFACTURING A SEMICONDUCTOR AND A SEMICONDUCTOR LIGHT-EMITTING DEVICE

(75) Inventors: Akihiko Ishibashi; Yuzaburo Ban; Yoshihiro Hara; Nobuyuki Uemura, all of Osaka; Masahiro Kume, Shiga, all of (JP)

(73) Assignee: Matsushita Electric Industrial Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/243,462

(22) Filed: Feb. 3, 1999

Related U.S. Application Data

(62) Division of application No. 08/872,154, filed on Jun. 10, 1997.

(30) Foreign Application Priority Data

Jun. 14, 1996 (JP) .................................................. 8-153953

(51) Int. Cl.$^7$ ....................... H01L 31/0312; H01L 33/00; H01L 27/15; H01L 31/12
(52) U.S. Cl. ............................... 257/77; 257/98; 257/79; 257/86; 257/80
(58) Field of Search ................................ 257/77, 98, 79, 257/80, 86

(56) References Cited

U.S. PATENT DOCUMENTS 5,389,571  2/1995  Takeuchi et al. ...................... 437/133

(List continued on next page.)

FOREIGN PATENT DOCUMENTS

| 7-235692 | 9/1995 | (JP) . |
| 8-032113 | 2/1996 | (JP) . |
| 8-056015 | 2/1996 | (JP) . |
| 10261816 | 9/1998 | (JP) . |

OTHER PUBLICATIONS

T. Warren Weeks, Jr. et al., "GaN thin films deposited via organometallic vapor phase epitaxy on α(6H)–SiC(0001) using high temperature monocrystalline AlN buffer layers," Applied Physics Letters, vol. 67, No. 3, pp. 401–403, Jul. 17, 1995.

(List continued on next page.)

*Primary Examiner*—Sheila V. Clark
*Assistant Examiner*—Jesse A. Fenty
(74) *Attorney, Agent, or Firm*—McDermott, Will & Emery

(57) ABSTRACT

First of all, a semiconductor substrate which consists of SiC is soaked for ten minutes in a buffered hydrofluoric acid, thereby the oxidized film formed on the surface of the semiconductor substrate being etched. Then, TMA, NH$_3$, TMG, and hydrogen for carrier are supplied at the rates of 10 μmol/min., 2.5 L/min., and 2 L/min., respectively to the semiconductor substrate at a temperature of 1090° C. by using MOVPE, thereby a buffer layer which consists of single crystal AlN and has a thickness of 15 nm being grown on the main surface of the semiconductor substrate. After lowering the temperature to 800° C., TMA, TMG, TMI, and NH$_3$ are supplied at the rates of 0.2 μmol/min., 2 μmol/min., 20 μmol/min., and 5 L/min., respectively, thereby a single crystal layer which consists of AlGaInN being grown on the buffer layer.

5 Claims, 9 Drawing Sheets

U.S. PATENT DOCUMENTS

| | | | |
|---|---|---|---|
| 5,432,808 | * | 7/1995 | Hatano et al. ............ 372/45 |
| 5,656,832 | * | 8/1997 | Ohba et al. ............ 257/190 |
| 5,661,074 | | 8/1997 | Tischler ............ 438/32 |

OTHER PUBLICATIONS

A. Kuramata et al., "MOVPE Growth of GaN on Various Cleavable Substrates", International Symposium on Blue Laser and Light Emitting Diodes, pp. 80–85, Mar. 5–7, 1996.

F.A. ponce et al., "Microstructure of GaN epitaxy on SiC using AlN buffer layers", Appl. Phys. Lett., vol. 67, No. 3, pp. 410–412, Jul. 17, 1995.

T. Sasaki et al., "Substrate–polarity dependence of metal–organic vapor–phase epitaxy–grown GaN on SiC," Journal of APPLIED PHYSICS, vol. 64, No. 9, pp. 4531–4535, Nov. 1, 1988.

\* cited by examiner

Fig. 3

| AlN buffer layer thickness (nm) | 0~10 | 10~25 | 25~ |
|---|---|---|---|
| growth mechanism | coherent to SiC | dislocation in the vicinity of the buffer layer | coherent to AlN |
| X-ray half-width of GaN | 3 minutes | 5 minutes | 1 minute |
| crack | presence | no | presence |
| surface evenness | uneven | even | even |

Fig. 4(a)   X-ray half-width: 300arc-sec
AlN buffer layer thickness: 15nm
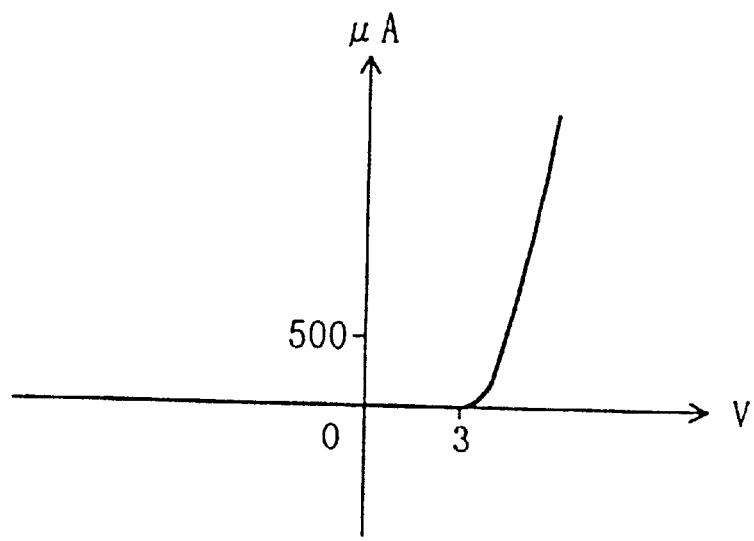
Fig. 4(b)   X-ray half-width: 100arc-sec
AlN buffer layer thickness: 200nm
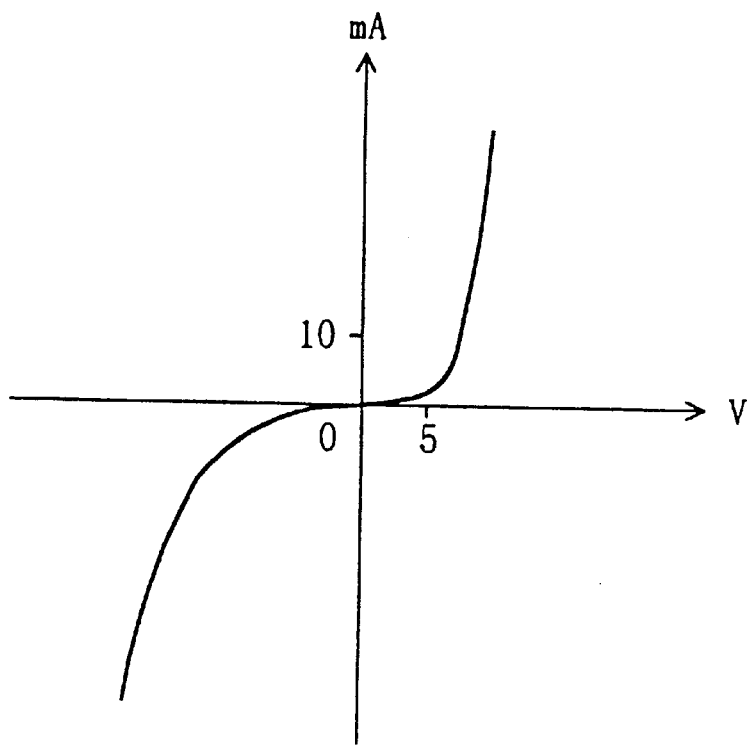

METHOD OF MANUFACTURING A SEMICONDUCTOR AND A SEMICONDUCTOR LIGHT-EMITTING DEVICE

This is a Divisional of U.S. patent application Ser. No. 08/872,154 filed Jun. 10, 1997.

BACKGROUND OF THE INVENTION

The present invention relates to a method of manufacturing a semiconductor used in light-emitting devices such as a light-emitting diode device or a semiconductor laser diode device having wavelengths in the region from blue to ultraviolet, and more specifically to a method of manufacturing a gallium nitride semiconductor which has excellent electric and optical properties by using a vapor-phase growth process.

Recently, short-wave light-emitting devices which have wavelengths shorter than blue light have been promising as a light source for full-color display or an optical disk capable of performing high-density recording. Such short-wave light-emitting devices have been vigorously studied by utilizing semiconductors which employ II–IV family compounds such as zinc selenide (ZnSe), IV family compounds such as silicon carbide (SiC), and III–V family compounds such as gallium nitride (GaN). Since blue light-emitting diodes which employ GaN, GaInN, or the like among the III–V family compounds have been realized, light-emitting devices which utilize these gallium nitride semiconductors have been drawing attention.

In order to grow crystals in gallium nitride semiconductors, a metalorganic vapor-phase epitaxy process (MOVPE) and a molecular beam epitaxy process (MBE) are generally used. When the single crystal of GaN is grown by a vapor-phase process, either SiC or sapphire ($Al_2O_3$) is used as the substrate.

In the case where SiC is used as the substrate, a SiC substrate consisting of 6H polycrystal-type and having a (0001) surface is used. As shown in FIG. 10, SiC has a lattice mismatching rate of as small as about 3% with GaN, and has a much smaller lattice mismatching rate of 1% with aluminum nitride (AlN). For this reason, SiC has become promising especially in these days as the substrate of a nitride compound semiconductor. Unlike sapphire, SiC has a conductivity, which enables a SiC substrate to have an electrode on the back side thereof. Consequently, a light-emitting device such as a laser device can be obtained by a simple process.

According to the above-mentioned MOVPE, trimethylaluminum (TMA), which is metalorganic, and ammonia ($NH_3$) are supplied onto a SiC substrate by using hydrogen ($H_2$) as a carrier gas, and as a result, a single crystal consisting of AlN is grown as a buffer layer on the substrate at a temperature of about 1000° C. Then, the supply of TMA is suspended and in turn trimethylgallium (TMG) is supplied onto the substrate with a temperature fixed at 1000° C., thereby a single crystal consisting of GaN being grown on the buffer layer. The buffer layer consisting of AlN most generally has a thickness of about 50 nm, and has not been doped, so that it has a high resistance and a low conductivity. It has been reported that the dislocation density of GaN on the buffer layer on the SiC substrate in this case is $10^9$ cm$^{-2}$.

However, the conventional method of manufacturing a gallium nitride semiconductor has the following problem. When a semiconductor crystal layer which composes a device such as a clad layer or an active layer grows on the buffer layer which has grown on the SiC substrate, the semiconductor crystal layer suffers cracks.

SUMMARY OF THE INVENTION

The present invention has an object of solving the above-mentioned conventional problem, thereby manufacturing a gallium nitride semiconductor which suffers no cracks, and has an even surface and excellent electric and optical properties.

The first method of manufacturing a semiconductor in accordance with the present invention comprises the steps of growing a buffer layer consisting of AlN on a semiconductor layer consisting of silicon carbide in such a manner that the buffer layer has a thickness of between 10 nm and 25 nm, inclusive; and growing on the buffer layer a single crystal layer consisting of $Al_xGa_{1-x-y}In_yN$ (x and y are real numbers where $0 \leq x \leq 1$, $0 \leq y \leq 1$, and $x+y \leq 1$).

In the first method of manufacturing a semiconductor, because the buffer layer consisting of AlN is grown to have a thickness of between 10 nm and 25 nm, inclusive on the semiconductor layer consisting of silicon carbide, the crystallinity of the buffer layer is not sufficient. As a result, dislocation is caused on the interface between the SiC semiconductor layer and the buffer layer, and on the interface between the buffer layer and the single crystal layer consisting of $Al_xGa_{1-x-y}In_yN$. This dislocation reduces the lattice mismatching between the buffer layer and the single crystal layer, which prevents the single crystal layer which grows on the buffer layer from suffering cracks. Consequently, a satisfactory single crystal layer with excellent surface evenness can be obtained.

In the first method of manufacturing a semiconductor, it is preferable that the step of growing the buffer layer includes a step of growing the buffer layer at a temperature of 1000° C. Under this condition, unlike a polycrystalline buffer layer, the AlN buffer layer has a single crystal and has a conductivity, so that current can be injected from the opposite side of the main surface of the semiconductor substrate. Consequently, it becomes easier to construct a p-n junction with an n-type semiconductor substrate when a device is manufactured.

In the first method of manufacturing a semiconductor, it is preferable that the step of growing the buffer layer includes a step of growing the buffer layer without doping it with impurities. Under this condition, the single crystal which grows on the buffer layer hardly suffers cracks. Even if not being doped with impurities, the buffer layer, which has a thickness of between 10 nm and 25 nm, inclusive, can be supplied with tunnel current. As a result, the semiconductor can have a simple structure by forming an electrode on the side opposite to the main surface of the buffer layer on the semiconductor substrate.

The second method of manufacturing a semiconductor in accordance with the present invention comprises the steps of growing a buffer layer consisting of AlGaN on a semiconductor layer consisting of silicon carbide in such a manner that the buffer layer has a thickness of between 10 nm and 25 nm, inclusive; and growing on the buffer layer a single crystal layer consisting of $Al_xGa_{1-x-y}In_yN$ (x and y are real numbers where $0 \leq x \leq 1$, $0 \leq y \leq 1$, and $x+y \leq 1$).

In the second method of manufacturing a semiconductor, because the buffer layer consisting of AlGaN is grown to have a thickness of between 10 nm and 25 nm, inclusive on the semiconductor layer consisting of silicon carbide, the crystallinity of the buffer layer is not sufficient. As a result, dislocation is caused on the interface between the SiC semiconductor layer and the buffer layer, and on the interface between the buffer layer and the single crystal layer consisting of $Al_xGa_{1-x-y}In_yN$. This dislocation reduces the lattice mismatching between the buffer layer and the single crystal layer. The lattice mismatching is further reduced by the lattice constant of AlGaN in the buffer layer having a value between that of SiC and that of GaN. Consequently, a gallium nitride single crystal layer with a higher quality can be obtained.

The third method of manufacturing a semiconductor in accordance with the present invention comprises the steps of growing a first buffer layer consisting of AlN on a semiconductor layer consisting of silicon carbide in such a manner that the first buffer layer has a thickness of between 10 nm and 25 nm, inclusive; growing a second buffer layer consisting of AlGaN on the first buffer layer; and growing on the second buffer layer a single crystal layer consisting of $Al_xGa_{1-x-y}In_yN$ (x and y are real numbers where $0 \leq x < 1$, $0 < y \leq 1$, and $x+y \leq 1$).

In the third method of manufacturing a semiconductor, because the first buffer layer consisting of AlN and the second buffer layer consisting of AlGaN are grown to have a thickness of between 10 nm and 25 nm, inclusive on the semiconductor layer consisting of silicon carbide, the crystallinity of these buffer layers is not sufficient. As a result, dislocation is caused on the interface between the SiC semiconductor layer and the first buffer layer, and on the interface between the second buffer layer and the single crystal layer consisting of $Al_xGa_{1-x-y}In_yN$. This dislocation reduces the lattice mismatching between the second buffer layer and the single crystal layer. In addition, the condition of y>0 in the single crystal layer consisting of $Al_xGa_{1-x-y}In_yN$ indicates that indium which increases the lattice constant is an essential component in the single crystal layer. Among gallium nitride compounds, AlN in the first buffer layer has the smallest lattice mismatching rate of about 1% with SiC, so that the lattice matching between the semiconductor substrate and the single crystal layer is improved even if the lattice constant of the second buffer layer is relatively increased. As a result, the crystallinity of the single crystal layer is further enhanced.

The fourth method of manufacturing a semiconductor in accordance with the present invention comprises the steps of growing a buffer layer consisting of $Al_xGa_{1-x-y}In_yN$ (x and y are real numbers where $0<x<1$, $0<y<1$, and $x+y<1$) on a semiconductor layer consisting of silicon carbide in such a manner that the buffer layer has a thickness of between 10 nm and 25 nm, inclusive; and growing on the buffer layer a single crystal layer consisting of $Al_xGa_{1-x-y}In_yN$.

In the fourth method of manufacturing a semiconductor, because the buffer layer consisting of $Al_xGa_{1-x-y}In_yN$ is grown to have a thickness of between 10 nm and 25 nm, inclusive on the semiconductor layer consisting of silicon carbide, the crystallinity of the buffer layer is not sufficient. As a result, dislocation is caused on the interface between the SiC semiconductor layer and the buffer layer, and on the interface between the buffer layer and the single crystal layer consisting of $Al_xGa_{1-x-y}In_yN$. This dislocation reduces the lattice mismatching between the buffer layer and the single crystal layer. In addition, since the buffer layer is not doped with impurities, no cracks are caused when a semiconductor crystal layer which composes a device such as an active layer or a clad layer grows on the buffer layer.

In the fourth method of manufacturing a semiconductor, it is preferable that the buffer layer growth process includes a step of growing the buffer layer in such a manner that the lattice constant of the buffer layer has a value between that of AlN and that of the single crystal layer. Under this condition, it is secured that the buffer layer reduces the lattice mismatching between the substrate and the single crystal layer, which enhances the crystallinity of the single crystal layer.

The fifth method of manufacturing a semiconductor in accordance with the present invention comprises the steps of growing a first buffer layer consisting of AlN on a semiconductor layer consisting of silicon carbide in such a manner that the first buffer layer has a thickness of between 10 nm and 25 nm, inclusive; growing a second buffer layer consisting of $Al_xGa_{1-x-y}In_yN$ (x and y are real numbers where $0<x<1$, $0<y<1$, and $x+y<1$) on the first buffer layer; and growing on the second buffer layer a single crystal layer consisting of $Al_xGa_{1-x-y}In_yN$. The step of growing the second buffer layer includes a step of growing the second buffer layer in such a manner that the second buffer layer has a value between that of the first buffer layer and that of the single crystal layer.

In the fifth method of manufacturing a semiconductor, because the first buffer layer consisting of AlN and the second buffer layer consisting of $Al_xGa_{1-x-y}In_yN$ are grown to have a thickness of between 10 nm and 25 nm, inclusive on the semiconductor layer consisting of silicon carbide, the crystallinity of these buffer layers is not sufficient. As a result, dislocation is caused on the interface between the SiC semiconductor layer and the first buffer layer, and on the interface between the second buffer layer and the single crystal layer consisting of $Al_xGa_{1-x-y}In_yN$. This dislocation reduces the lattice mismatching between the second buffer layer and the single crystal layer. In addition, the second buffer layer is grown in such a manner that the lattice constant of the second buffer layer consisting of $Al_xGa_{1-x-y}In_yN$ has a value between that of the first buffer layer consisting of AlN and that of the single crystal layer consisting of $Al_xGa_{1-x-y}In_yN$. As a result, the lattice matching between the first buffer layer and the single crystal layer is enhanced, thereby the crystallinity of the single crystal layer being further enhanced.

The sixth method of manufacturing a semiconductor in accordance with the present invention comprises the steps of removing an oxidized film formed on a C surface of a semiconductor substrate consisting of silicon carbide, the C surface being an exposure surface where carbon atoms are exposed; and growing a semiconductor layer consisting of $Al_xGa_{1-x-y}In_yN$, (x and y are real numbers where $0 \leq x \leq 1$, $0 \leq y \leq 1$, and $x+y \leq 1$) on the C surface from which the oxidized film has been removed.

In the sixth method of manufacturing a semiconductor, the oxidized film is removed from the C surface, on which carbon atoms are exposed, of the semiconductor substrate consisting of silicon carbide. Therefore, the semiconductor layer consisting of $Al_xGa_{1-x-y}In_yN$ can be grown without causing any crack although the C surface is more susceptible to oxidation than the Si surface which is on the side opposite to the C surface and on which silicon atoms are exposed. Consequently, by growing the semiconductor layer as a device structure such as an active layer or a clad layer, it is secured to obtain a device with excellent properties.

The sixth method of manufacturing a semiconductor preferably comprises a step of forming a conductive film, which becomes an electrode, on the Si surface which is an exposure surface where silicon atoms are exposed. Under this condition, the electrode is formed on the Si surface which is harder to be oxidized than the C surface, and as a result, the threshold voltage is reduced and other electric properties are improved.

The first semiconductor light-emitting device of the present invention comprises a first semiconductor layer consisting of silicon carbide; a buffer layer consisting of AlN, the buffer layer being formed on the semiconductor layer and having a thickness of between 10 nm and 25 nm, inclusive; and a second semiconductor layer consisting of $Al_xGa_{1-x-y}In_yN$ (x and y are real numbers where $0 \leq x \leq 1$, $0 \leq y \leq 1$, and $x+y \leq 1$), the second semiconductor layer being formed on the buffer layer.

In the first semiconductor light-emitting device, because the buffer layer consisting of AlN is grown to have a thickness of between 10 nm and 25 nm, inclusive on the first semiconductor layer consisting of silicon carbide, the crystallinity of the buffer layer is not sufficient. As a result, dislocation is caused on the interface between the SiC first semiconductor layer and the buffer layer, and on the interface between the buffer layer and the second semiconductor layer consisting of $Al_xGa_{1-x-y}In_yN$. This dislocation reduces the lattice mismatching between the buffer layer and the second semiconductor layer, which prevents the second semiconductor layer which consists of gallium nitride and which grows on the buffer layer from suffering cracks. Consequently, it is secured to obtain an optical device with excellent properties by growing the second semiconductor layer as a device structure such as an active layer or a clad layer.

In the first semiconductor light-emitting device, it is preferable that the first semiconductor layer is a substrate consisting of silicon carbide, the buffer layer is formed on the Si surface which is an exposure surface where silicon atoms are exposed, and an electrode is formed on the Si surface where silicon atoms are exposed and which is on the side opposite to the C surface. Under these conditions, it is secured that the buffer layer consisting of AlN and the second semiconductor layer consisting of $Al_xGa_{1-x-y}In_yN$ are grown on the C surface of the substrate. In addition, an electrode is formed on the Si surface which is harder to be oxidized than the C surface, and as a result, the threshold voltage is reduced and other electric properties are improved.

In the first semiconductor light-emitting device, it is preferable that the first semiconductor layer is a semiconductor substrate which consists of silicon and has a carbonized main surface. Under this condition, a gallium nitride semiconductor light-emitting device can be obtained by using a substrate consisting of silicon which is much more available than a semiconductor substrate consisting of SiC.

In the first semiconductor light-emitting device, it is preferable that the buffer layer is a non-dope layer, which is not doped with impurities. Under this condition, the single crystal layer which composes a device hardly suffers cracks.

The second semiconductor light-emitting device of the present invention comprises a first semiconductor layer consisting of silicon carbide; a buffer layer consisting of either $Al_xGa_{1-x}N$ (x is a real number where $0<x<1$) or $Al_xGa_{1-x-y}In_yN$ (x and y are real numbers where $0<x<1$, $0<y<1$, and $x+y<1$), the buffer layer being formed on the first semiconductor layer and having a thickness of between 10 nm and 25 nm, inclusive; and a second semiconductor layer consisting of $Al_xGa_{1-x-y}In_yN$ (x and y are real numbers where $0 \leq x \leq 1$, $0 \leq y \leq 1$, and $x+y \leq 1$), the second semiconductor layer being formed on the buffer layer.

In the second semiconductor light-emitting device, because the buffer layer consisting of either $Al_xGa_{1-x}N$ or $Al_xGa_{1-x-y}In_yN$ is grown to have a thickness of between 10 nm and 25 nm, inclusive on the first semiconductor layer consisting of silicon carbide, the crystallinity of the buffer layer is not sufficient. As a result, dislocation is caused on the interface between the SiC first semiconductor layer and the buffer layer, and on the interface between the buffer layer and the second semiconductor layer consisting of $Al_xGa_{1-x-y}In_yN$. This dislocation reduces the lattice mismatching between the buffer layer and the second semiconductor layer, which prevents the second semiconductor layer which consists of gallium nitride and which grows on the buffer layer from suffering cracks. Consequently, it is secured to obtain an optical device with excellent properties by growing the second semiconductor layer as a device structure such as an active layer or a clad layer.

BRIEF DESCRIPTION OF THE DRAWINGS

FIG. 3 is a table which shows the relation between the thickness of the buffer layer and the crack density, the results of X-ray analysis, and the surface evenness of a GaN single crystal which is obtained by the method of manufacturing a semiconductor in accordance with the first embodiment of the present invention.

FIGS. 4(a) and 4(b) show the current-voltage properties in p-n junction consisting of a p-type GaN layer and an n-type GaN layer which are formed on an n-type SiC semiconductor substrate which is obtained by the method of manufacturing a semiconductor in accordance with the first embodiment of the present invention, wherein FIG. 4(a) is a graph which shows the case where an AlN buffer layer has a thickness of 15 nm, and FIG.4(b) is a graph which shows the case where the AlN buffer layer has a thickness of 200 nm.

FIGS. 7(a) and 7(b) show the surface evenness of the semiconductor which is obtained by the method of manufacturing a semiconductor in accordance with the first embodiment of the present invention, wherein FIG. 7(a) shows the surface evenness of the GaN single crystal layer which is grown by disposing a buffer layer on the Si surface, on which silicon atoms are exposed, of the SiC semiconductor substrate, and FIG. 7(b) shows the surface evenness of the GaN single crystal layer which is grown by disposing a buffer layer on the C surface, on which carbon atoms are exposed, of the SiC semiconductor substrate.

DETAILED DESCRIPTION OF THE INVENTION

Embodiment 1

The first embodiment of the present invention will be described with reference to the drawings.

Figure 1:
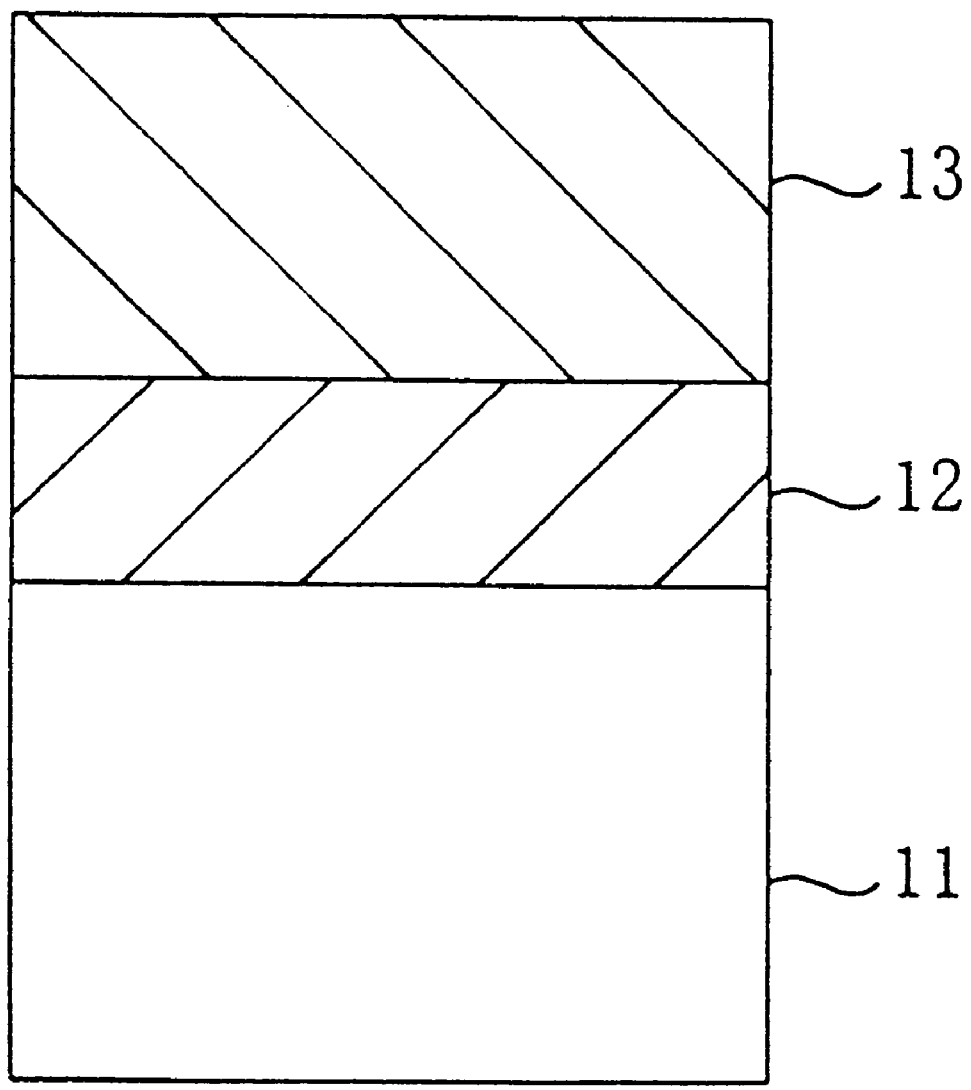
FIG. 1 is a structural cross section which shows the gallium nitride semiconductor which is obtained by the method of manufacturing a semiconductor in accordance with the first embodiment of the present invention.

FIG. 1 is a structural cross section which shows a gallium nitride semiconductor which is obtained by the method of manufacturing a semiconductor in accordance with the first embodiment of the present invention. First of all, in a process of removing an oxidized film, a semiconductor substrate 11 which consists of 6H-SiC and has (0001) surface is soaked for ten minutes in a buffered hydrofluoric acid which consists of ammonium fluoride ($NH_4F$) and hydrogen fluoride (HF) in a mixture ratio of 10:1, thereby the oxidized film formed on the surface of the semiconductor substrate 11 being etched.

Then, a desired semiconductor is grown on the semiconductor substrate 11 by using a metalorganic vapor-phase epitaxy process (MOVPE) as follows. Firstly, the semiconductor substrate 11 is mounted on the suscepter in a reaction furnace (not shown). The main surface on which the crystals are grown may be either the Si surface on which silicon atoms are exposed or the C surface on which carbon atoms are exposed.

After evacuating the reaction furnace under vacuum, the surface of the semiconductor substrate 11 is cleaned by applying a heat treatment for 15 minutes at 1100° C. in an atmosphere of hydrogen with a pressure of 70×133.3 Pa (133.3 Pa≈1 Torr).

After lowering the temperature to 1090° C., trimethylaluminum (TMA), ammonia ($NH_3$), and hydrogen for carrier are supplied to the reaction furnace at the rates of 10 μmol/min., 2.5 L/min., and 2 L/min., respectively. As a result, a buffer layer 12 which consists of a single crystal AlN and has a thickness of 15 nm is grown on the main surface of the semiconductor substrate 11.

After suspending the supply of TMA and lowering the temperature to 800° C., TMA, TMG, trimethylindium (TMI), and $NH_3$ are supplied to the reaction furnace at the rates of 0.2 μmol/min., 2 μmol/min., 20 μmol/min., and 5 L/min., respectively. As a result, a single crystal layer 13 which consists of AlGaInN is grown on the buffer layer 12 of the semiconductor substrate 11.

Thus, the single crystal layer 13 consists of a mixed crystal which can vary its composition so as to have the same lattice constant as GaN. Therefore, the single crystal layer 13 having such a high quality as not to suffer cracks can be used to manufacture a device having excellent electric and optical properties.

Through various experiments and investigations on the manufacturing method of a gallium nitride semiconductor having a SiC substrate, the inventors of the present invention have found that no cracks are caused on the surface of the single crystal layer 13 consisting of $Al_xGa_{1-x-y}In_yN$ (x and y are real numbers where $0 \leq x \leq 1$, $0 \leq y \leq 1$, and $x+y \leq 1$) which grows on the buffer layer 12, only if the buffer layer 12 has a thickness of between 10 nm and 25 nm, inclusive.

This finding will be detailed as follows with reference to the drawings.

Figure 2:
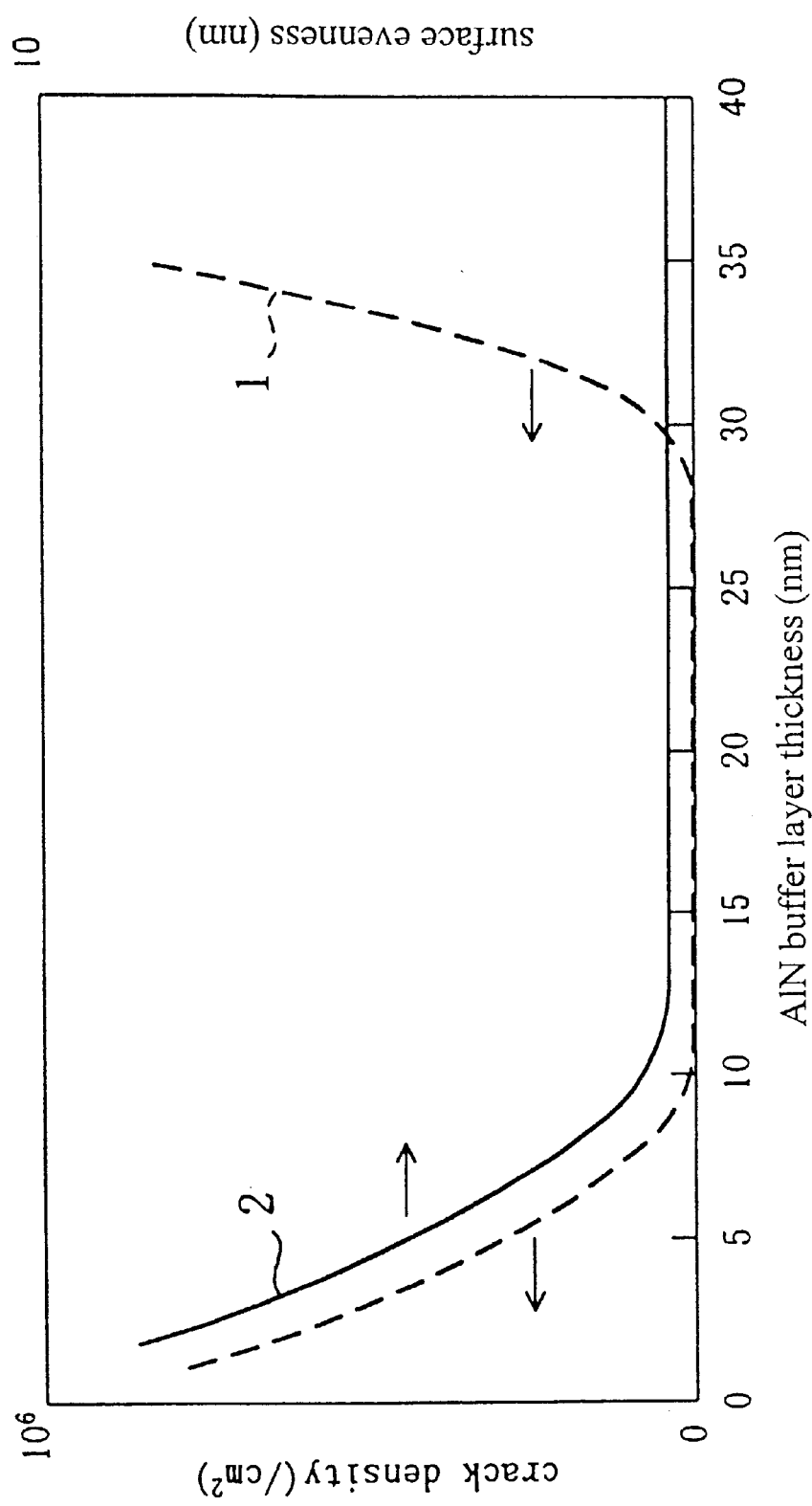
FIG. 2 is a diagram which shows the relation between the thickness of the buffer layer and the crack density and the surface evenness of a GaN single crystal which is obtained by the method of manufacturing a semiconductor in accordance with the first embodiment of the present invention.

FIG. 2 shows the relation between the thickness of an AlN buffer layer and the crack density and the surface evenness of a GaN single crystal which is obtained by the method of manufacturing a semiconductor which is composed of the AlN buffer layer disposed between the GaN single crystal and the SiC semiconductor substrate.

In FIG. 2, the broken lines 1 and 2 respectively indicate a crack density per 1 $cm^2$ and the surface evenness.

As indicated by the broken line 1 in FIG. 2, no cracks occur on the surface of the GaN single crystal when the buffer layer has a thickness of between 10 nm and 25 nm, inclusive. The reason for the occurrence of cracks when the buffer layer has a thickness of less than 10 nm is considered as follows. As shown in FIG. 3, the buffer layer is too thin to evenly cover the entire main surface of the SiC semiconductor substrate. As a result, the surface of the GaN single crystal layer which grows on the buffer layer becomes uneven. Furthermore, the thinness of the buffer layer causes the GaN single crystal layer to grow in such a manner as to conform its lattice constant to that of SiC in the substrate, which makes the lattice mismatching rate become as large as 3%.

On the other hand, the reason for the occurrence of cracks when the buffer layer has a thickness of larger than 25 nm is considered as follows. Since the crystallinity of the buffer layer is sufficiently improved, the surface evenness of the GaN single crystal which grows on the buffer layer is enhanced. However, the GaN single crystal grows in such a manner as to conform its lattice constant to that of AlN in the buffer layer, and there is a lattice mismatching rate of 2% between AlN and GaN.

When the thickness of the buffer layer is in a range between 10 nm and 25 nm, inclusive, which is a feature of the present invention, the buffer layer can evenly cover the entire main surface of the SiC semiconductor substrate. However, the crystallinity of AlN which composes the buffer layer is not sufficient, so that lattice defects such as dislocation are caused both on the interface between the semiconductor substrate and the buffer layer and on the interface between the buffer layer and the single crystal layer. Consequently, the orientation of the GaN single crystal which grows on the buffer layer becomes five minutes (=300 arc-sec) as shown in the column of X-ray half-width of GaN in FIG. 3, which is larger than other cases. Thus, the GaN single crystal layer grows while causing lattice defects such as dislocation in the vicinity of the buffer layer, thereby reducing the lattice mismatching between the semiconductor substrate and the buffer layer and between the buffer layer and the single crystal layer. As a result, the surface of the GaN single crystal layer becomes even and satisfactory without cracks.

It has been confirmed through an experiment that when a single crystal layer consisting of GaN is grown on a buffer layer which consists of either GaN or AlN in a polycrystalline state and which has been grown on the main surface of a SiC semiconductor substrate at a temperature of about 600° C., cracks are caused on the surface of the single crystal layer.

Unlike the conventional polycrystal buffer layer which is grown at a low temperature of 600° C., the AlN buffer layer 12 in accordance with the present embodiment has a conductivity because it is grown at a temperature of 1000° C. or higher and consists of a single crystal. Consequently, it is possible to inject current from the side opposite to the main surface of the semiconductor substrate 11.

Although the buffer layer 12 is not doped with impurities in order to prevent the occurrence of cracks, as shown in FIG. 4(a), a tunnel current is supplied to the buffer layer 12 and the current can be injected with a low resistance because the buffer layer 12 has a thickness of between 10 nm and 25 nm, inclusive.

FIGS. 4(a) and 4(b) show the current-voltage properties in p-n junction consisting of a p-type GaN layer and an n-type GaN layer which are formed on an n-type SiC semiconductor substrate which is obtained by the method of manufacturing a semiconductor in accordance with the first embodiment. FIG. 4(a) shows the case where the AlN buffer layer has a thickness of 15 nm, and FIG. 4(b) shows the case where the AlN buffer layer has a thickness of 200 nm. As shown in FIG. 4(a), the 15 nm thick buffer layer exhibits excellent rectification property whereas as shown in FIG. 4(b), the 200 nm thick buffer layer does not show the rectification property which is unique to the p-n junction, due to the occurrence of a leakage resulting from cracks.

A first variation of the first embodiment of the present invention will be described as follows with reference to the drawings.

Figure 5A:
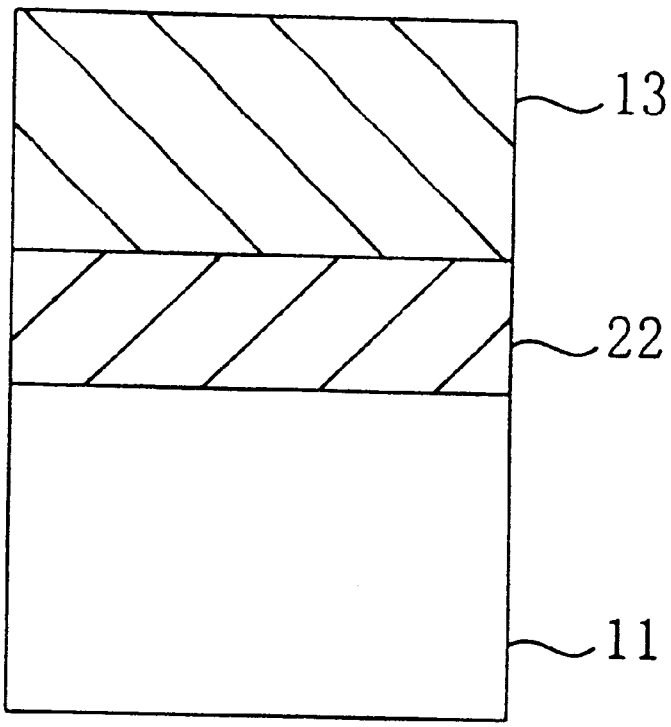
FIG. 5(a) is a structural cross section which shows the gallium nitride semiconductor which is obtained by the method of manufacturing a semiconductor in accordance with the first variation of the first embodiment.

FIG. 5(a) is a structural cross section which shows the semiconductor which is obtained by the method of manufacturing a semiconductor in accordance with the first variation of the first embodiment. The semiconductor is composed of a semiconductor substrate 11 consisting of 6H-SiC and having a (0001) surface, a buffer layer 22 consisting of AlGaN and having a thickness of between 10 nm and 25 nm, inclusive, and a single crystal layer 13 consisting of $Al_xGa_{1-x-y}In_yN$, which are accumulated in this order. This semiconductor can be manufactured in the same manner as in the first embodiment except that TMG is supplied in addition to TMA in the process of growing the buffer layer 22.

In the present variation, the lattice constant of the AlGaN buffer layer has a value between that of SiC and that of GaN, so that the buffer layer works effectively to reduce the lattice mismatching of about 3% between SiC and GaN.

A second variation of the first embodiment of the present invention will be described as follows with reference to the drawings.

Figure 5B:
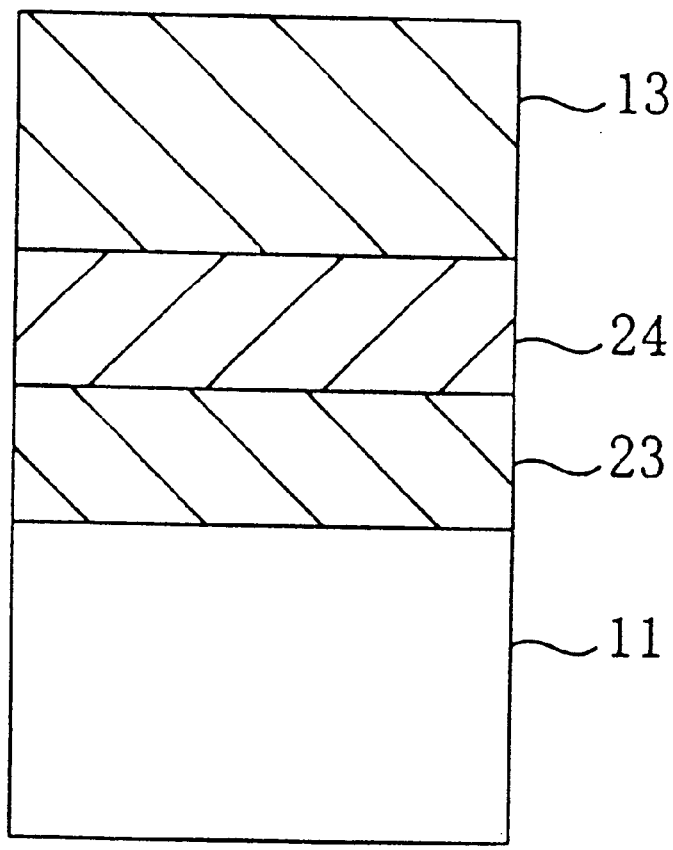
FIG. 5(b) is a structural cross section which shows the gallium nitride semiconductor which is obtained by the method of manufacturing a semiconductor in accordance with the second variation of the first embodiment.

FIG. 5(b) is a structural cross section which shows the semiconductor which is obtained by the method of manufacturing a semiconductor in accordance with the second variation of the first embodiment. The semiconductor is composed of a semiconductor substrate 11 consisting of 6H-SiC and having a (0001) surface, a first buffer layer 23 consisting of AlN and having a thickness of between 10 nm and 25 nm, inclusive, a second buffer layer 24 consisting of AlGaN and having a thickness of between 10 nm and 25 nm, inclusive, and a single crystal layer 13 consisting of $Al_xGa_{1-x-y}In_yN$ (x and y are real numbers where $0 \leq x<1$, $0<y \leq 1$, and $x+y \leq 1$) which are accumulated in this order. This semiconductor can be manufactured in the same manner as in the first embodiment except that a process of growing a second buffer layer is additionally provided for supplying TMG together with TMA after the process of growing the first buffer layer.

In the present variation, the single crystal layer 13 contains indium which increases the lattice constant as an essential component. Since the lattice mismatching between AlN which composes the first buffer layer 23 and SiC is as small as about 1%, even when the second buffer layer 24 which consists of AlGaN has a composition close to GaN and has a large lattice constant, the first buffer layer 23 works to improve the lattice matching between the second buffer layer 24 and the semiconductor substrate 11. As a result, the crystallinity of the single crystal layer 13 is further enhanced.

Figure 6A:
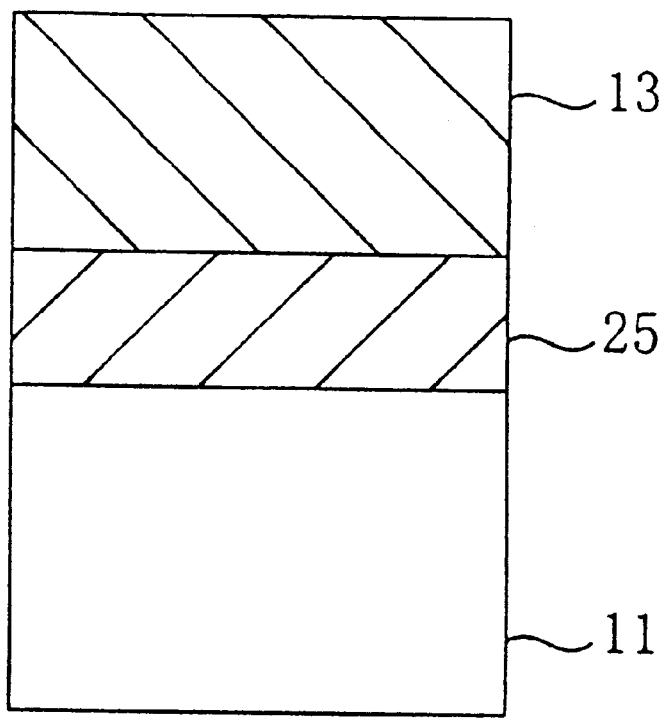
FIG. 6(a) is a structural cross section which shows the gallium nitride semiconductor which is obtained by the method of manufacturing a semiconductor in accordance with the third variation of the first embodiment.

FIG. 6(a) is a structural cross section which shows the semiconductor which is obtained by the method of manufacturing a semiconductor in accordance with the third variation of the first embodiment. The semiconductor is composed of a semiconductor substrate 11 consisting of 6H-SiC and having a (0001) surface, a buffer layer 25 consisting of $Al_xGa_{1-x-y}In_yN$ (x and y are real numbers where $0<x<1$, $0<y<1$, and $x+y<1$) and having a thickness of between 10 nm and 25 nm, inclusive, and a single crystal layer 13 consisting of $Al_xGa_{1-x-y}In_yN$ which are accumulated in this order. This semiconductor can be manufactured in the same manner as in the first embodiment except that TMG and TMI are supplied in addition to TMA in the process of growing the buffer layer 25.

The mix crystal composition of the buffer layer 25 may be the same as that of the single crystal layer 13 which consists of $Al_xGa_{1-x-y}In_yN$ and grows on the buffer layer 25. It is preferable that the lattice constant of the buffer layer 25 has as close a value to that of AlN as possible, that is, as close a value to that of SiC as possible. Under this condition, the buffer layer 25 reduces the lattice mismatching between the semiconductor substrate 11 and the single crystal layer 13, thereby making the single crystal layer 13 have high quality.

In the present variation, the buffer layer 25 is not doped with any impurities, so that no cracks occur when the single crystal layer 13 which composes a device such as a clad layer or an active layer is grown on the buffer layer 25.

A fourth variation of the first embodiment of the present invention will be described as follows with reference to the drawings.

Figure 6B:
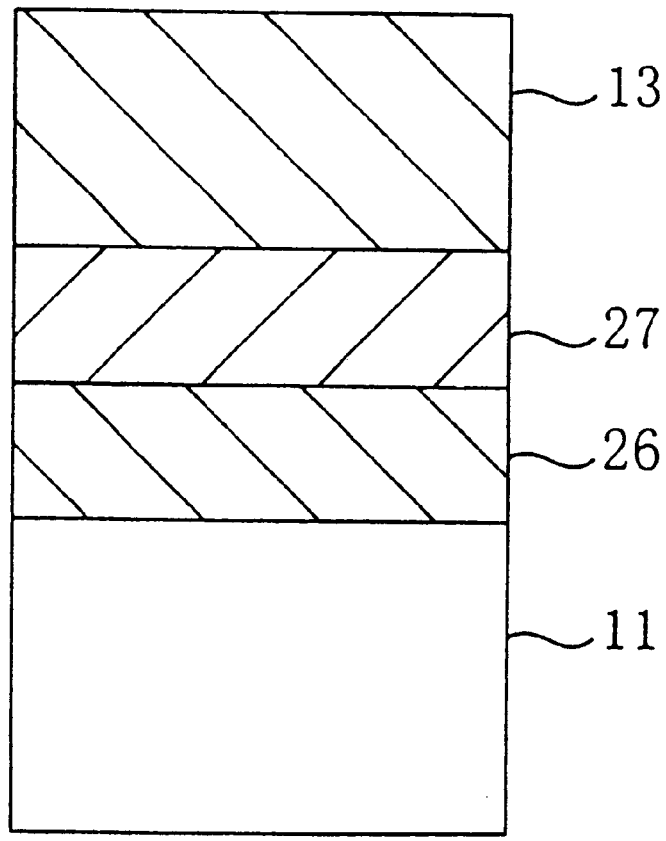
FIG. 6(b) is a structural cross section which shows the gallium nitride semiconductor which is obtained by the method of manufacturing a semiconductor in accordance with the fourth variation of the first embodiment.

FIG. 6(b) is a structural cross section which shows the semiconductor which is obtained by the method of manufacturing a semiconductor in accordance with the third variation of the first embodiment. The semiconductor is composed of a semiconductor substrate 11 consisting of 6H-SiC and having a (0001) surface, a first buffer layer 26 consisting of AlN and having a thickness of between 10 nm and 25 nm, inclusive, a second buffer layer 27 consisting of $Al_xGa_{1-x-y}In_yN$ (x and y are real numbers where $0<x<1$, $0<y<1$, and $x+y<1$) and having a thickness of between 10 nm and 25 nm, inclusive, and a single crystal layer 13 consisting of $Al_xGa_{1-x-y}In_yN$, which are accumulated in this order. This semiconductor can be manufactured in the same manner as in the first embodiment except that a process of growing a second buffer layer is additionally provided for supplying TMG and TMI together with TMA after the process of growing the first buffer layer.

In the present variation, among gallium nitride compounds, AlN which composes the first buffer layer 26 has the smallest lattice mismatching rate of 1% with SiC, so that AlN works to improve the lattice matching between the second buffer layer 27 which consists of $Al_xGa_{1-x-y}In_yN$ and the single crystal layer 13. As a result, the crystallinity of the single crystal layer 13 is further enhanced.

In the first embodiment and these variations, SiC is used as a substrate for growing the single crystal layer 13 consisting of $Al_xGa_{1-x-y}In_yN$; however, the same effects can be obtained by forming a SiC semiconductor layer by carbonizing the main surface of a Si substrate and by forming an AlN buffer layer on the semiconductor layer. This makes it possible to obtain a high-quality gallium nitride semiconductor by using a Si semiconductor substrate which is easily available.

The effects of the process of removing the oxidized film in the present embodiment will be described with reference to the drawings.

Figure 7A:
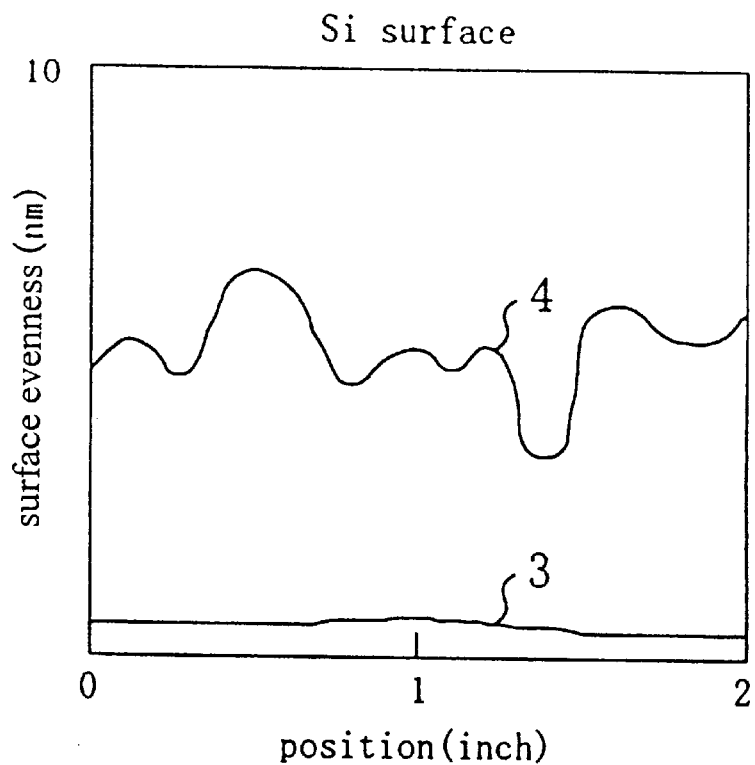
Figure 7B:
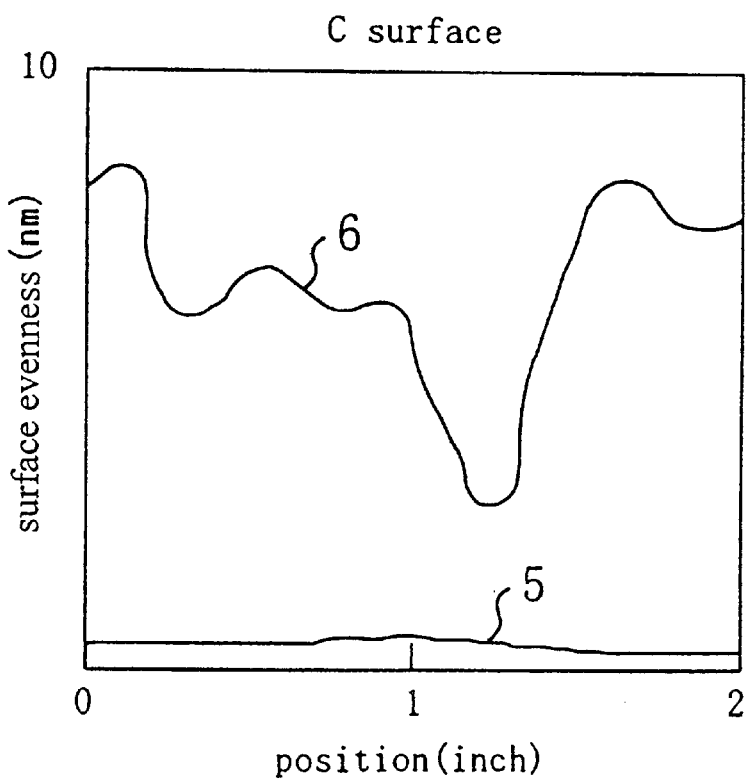

FIGS. 7(a) and 7(b) show the surface evenness of semiconductors which are obtained by the method of manufacturing a semiconductor in accordance with the present embodiment. To be more specific, FIG. 7(a) shows the surface evenness of the GaN single crystal layer which is grown by disposing a buffer layer on the Si surface, on which silicon atoms are exposed, of a SiC semiconductor substrate. FIG. 7(b) shows the surface evenness of the GaN single crystal layer which is grown by disposing a buffer layer on the C surface, on which carbon atoms are exposed, of the SiC semiconductor substrate. In FIG.7 (a), the curve 3 indicates the surface evenness of the Si surface of the GaN single crystal layer which has been subjected to the process of removing the oxidized film in accordance with the present embodiment, and the curve 4 indicates the surface evenness of the Si surface of the GaN single crystal layer which has not been subjected to the process of removing the oxidized film. In FIG. 7(b), the curve 5 indicates the surface evenness of the C surface of the GaN single crystal layer which has been subjected to the process of removing the oxidized film in accordance with the present embodiment, and the curve 6 indicates the surface evenness of the C surface of the GaN single crystal layer which has not been subjected to the process of removing the oxidized film.

The curve 4 in FIG. 7(a) and the curve 6 in FIG. 7(b) indicate that when the SiC semiconductor substrate has not been subjected to the process of removing the oxidized film before the growth of the crystal, the surface evenness is insufficient because the oxidized film prevents a uniform two-dimensional growth. As shown by the curve 6 in FIG. 7(b), the C surface is more susceptible to oxidation and more uneven than the Si surface, so that the crystal growth which forms a fine device structure such as a quantum well structure is difficult.

However, as shown in the present embodiment, the use of a buffered hydrofluoric acid to remove an oxidized film formed over the surface of the SiC semiconductor substrate makes it possible to greatly improve the surface evenness of both the Si surface and the C surface of the semiconductor substrate.

In the present embodiment, the MOVPE is employed for growing the semiconductor crystal, which is not limited. In detail, the specified thickness of the buffer layer consisting of AlN provides improvement in crystallinity of GaN semiconductor glowing on the buffer layer. Therefore, it goes without saying that the same effects are obtained by employing epitaxy using a liquid phase or molecular beam.

Embodiment 2

The second embodiment of the present invention will be described with reference to the drawings.

Figure 8:
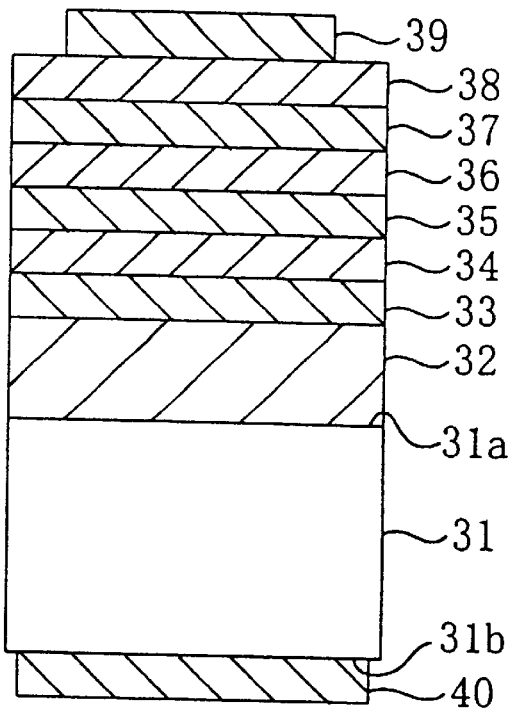
FIG. 8 is a structural cross section which shows the semiconductor light-emitting device in accordance with the second embodiment of the present invention.

FIG. 8 shows a structural cross section of the semiconductor laser device which is a semiconductor light-emitting device in accordance with the second embodiment of the present invention. The SiC semiconductor substrate has a C surface on which a gallium nitride semiconductor crystal is grown and a Si surface on which an electrode is formed.

The following is a brief description of the method of manufacturing a semiconductor laser device in accordance with the present embodiment. First of all, in the process of removing the oxidized film prior to the vapor-phase growth, an n-type semiconductor substrate 31 which consists of 6H-SiC and has (0001) surface is soaked for ten minutes in a buffered hydrofluoric acid which consists of ammonium fluoride ($NH_4F$) and hydrogen fluoride (HF) in a mixture ratio of 10:1. As a result, the oxidized film formed on the surface of the n-type semiconductor substrate 11 is etched.

Then, the n-type semiconductor substrate 31 is mounted on the heating scepter in a reaction furnace with the C surface 31a as the main surface, and each semiconductor layer is grown in series on the C surface 31a by using the same MOVPE as in the first embodiment. To be more specific, as shown in FIG. 8 the following semiconductor layers are sequentially grown on the C surface 31a of the n-type semiconductor substrate 31: a buffer layer 32 consisting of AlN, having a thickness of between 10 nm and 25 nm, inclusive, and being provided for the lattice matching between the n-type semiconductor substrate 31 and the gallium nitride semiconductor which is grown thereon, an n-type clad layer 33 consisting of n-type $Al_xGa_{1-x-y}In_yN$ and being provided for guiding a generated laser beam, an n-type guide layer 34 consisting of n-type GaN and being provided for efficiently injecting carrier, an active layer 35 consisting of InGaN and being provided for generating a laser beam, a p-type guide layer 36 consisting of p-type GaN and being provided for efficiently injecting carrier, a p-type clad layer 37 consisting of p-type $Al_xGa_{1-x-y}In_yN$ and being provided for guiding the generated light together with the n-type clad layer 33, and a p-type contact layer 38 consisting of p-type GaN and being provided for ohmic contact with the electrode. Then, a p-type electrode 39 is formed on the p-type contact layer 38, whereas an n-type electrode 40 is formed on the Si surface 31b of the n-type semiconductor substrate 31.

The active layer 35 consisting of InGaN contains about 20% of indium and whose laser beam has wavelengths of 410 nm to 420 nm.

A comparative semiconductor layer device is manufactured by growing each semiconductor crystal layer on the Si surface of the n-type semiconductor substrate 31, so as to compare with the semiconductor layer device of the present embodiment, and the results of the comparison are shown below.

Figure 9:
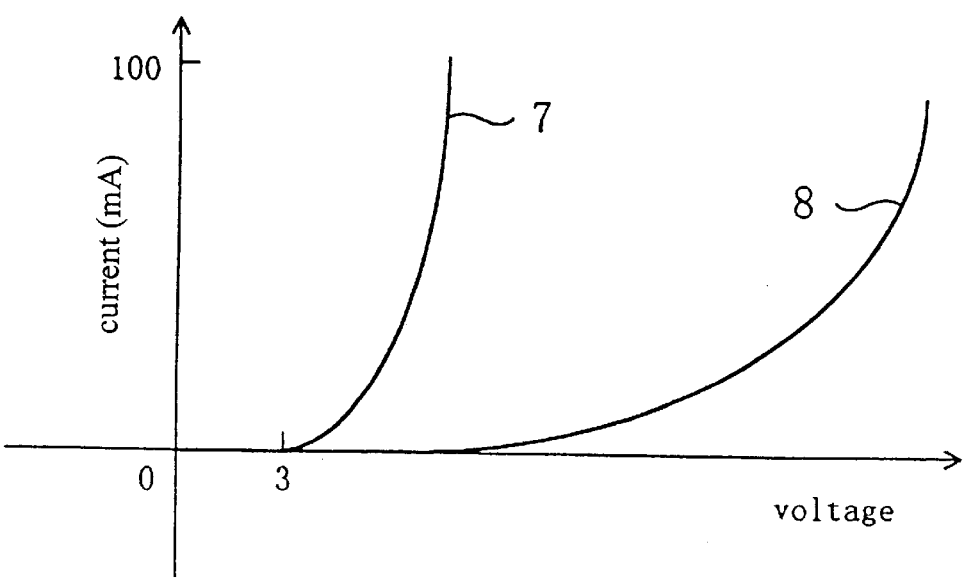
FIG. 9 is a graph which shows the current-voltage properties of the semiconductor light-emitting device in accordance with the second embodiment of the present invention and a comparative semiconductor light-emitting device.
Figure 10:
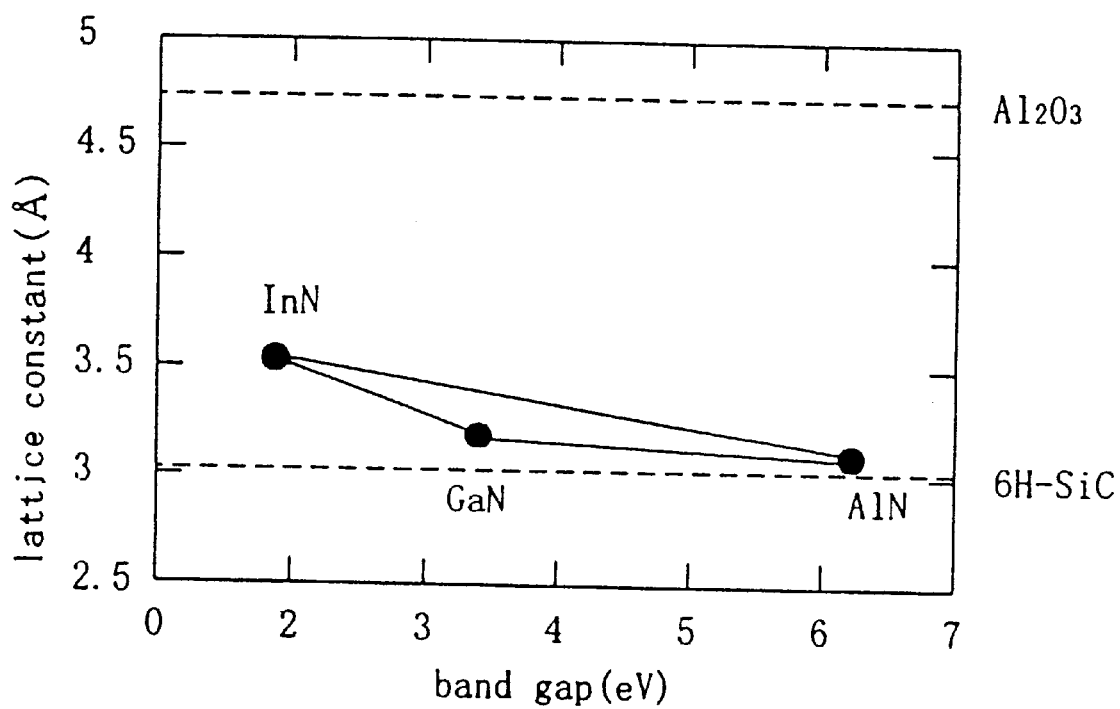
FIG. 10 is a graph which shows the relation between the lattice constant of gallium nitride semiconductors and the band gaps.

FIG. 9 shows the current-voltage properties of the semiconductor laser device according to the present embodiment and of the comparative semiconductor laser device. The curves 7 and 8 indicate the semiconductor laser device according to the present embodiment and the comparative semiconductor laser device, respectively. It is obvious that when a crystal is grown on the C surface 31a of the n-type semiconductor substrate 31 and an n-type electrode 40 is formed on the Si surface 31b opposite to the C surface as shown by the curve 7, the threshold voltage and electric resistance become smaller, thereby the properties being improved, as compared with the case where the crystal is grown on the Si surface 31b of the n-type semiconductor substrate 31, and the n-type electrode 40 is formed on the C surface 31a opposite to the Si surface as shown by the curve 8. The reason for this result is considered that when the surface opposite to the main surface of the n-type semiconductor substrate 31 is the C surface, it is susceptible to oxidation, and the contact resistance is increased by the oxidized film which is spontaneously formed on the C surface.

Thus, in the present embodiment, when a gallium nitride semiconductor laser device is manufactured by using the n-type semiconductor substrate 31 consisting of SiC, the C surface 31a is made to be the main surface on which a crystal is grown whereas the Si surface 31b is made to be the opposite surface on which an electrode is formed, and as a result, the electric properties can be improved. Consequently, it is secured to obtain a gallium nitride semiconductor laser device which successively oscillates violet light with wavelengths of 410 nm to 420 nm at a room temperature.

If the buffer layer 32 consisting of AlN is not doped with impurities, it becomes harder to cause cracks on the surface of each single crystal layer which composes a device structure. However, even if the buffer layer 32 is doped with impurities, the occurrence of cracks can be sufficiently reduced by making the buffer layer 32 have a thickness of between 10 nm and 25 nm, inclusive in accordance with in the present embodiment.

Although buffered hydrofluoric acid is used for etching the oxidized film formed on the surface of the SiC semiconductor substrate 31, it goes without saying that other acids or alkali can be used to obtain the same effects.

Needless to say, the light-emitting device according to the present embodiment can be applied for manufacturing a gallium nitride electric device besides the semiconductor laser device.

What is claimed is:

1. A semiconductor light-emitting device comprising:
    a first semiconductor layer consisting of silicon carbide;
    a buffer layer consisting of AlN, said buffer layer being formed on said first semiconductor layer and having a thickness which is greater than 10 nm and smaller than or equal to 25 nm; and
    a second semiconductor layer consisting of $Al_xGa_{1-x-y}In_yN$, x and y being real numbers where $0 \leq x \leq 1$, $0 \leq y \leq 1$, and $x+y \leq 1$, said second semiconductor layer being formed on said buffer layer.

2. The semiconductor light-emitting device according to claim 1,
    wherein said first semiconductor layer is a substrate consisting of silicon carbide;
    said buffer layer is formed on a C surface of said substrate, the C surface being an exposure surface where carbon atoms are exposed; and
    an electrode is formed on a Si surface where silicon atoms are exposed, said Si surface being on an opposite side of the C surface.

3. The semiconductor light-emitting device according to claim 1, wherein said first semiconductor layer is a semiconductor substrate which consists of silicon and has a carbonized main surface.

4. The semiconductor light-emitting device according to claim 1, wherein said buffer layer is a non-dope layer, which is not doped with impurities.

5. A semiconductor light emitting device comprising:
    a first semiconductor layer consisting of silicon carbide;
    a buffer layer consisting of one of $Al_xGa_{1-x}N$, x is a real number where $0<x<1$ and $Al_xGA_{1-x-y}In_yN$, x and y are real numbers where $0<x<1$, and $x+y<1$, said buffer layer being formed on said first semiconductor layer and having a thickness which is greater than 10 nm and smaller than or equal to 25 nm; and
    a second semiconductor layer consisting of $Al_xGa_{1-x-y}In_yN$, x and y being real numbers where $0 \leq x \leq 1$, $0 \leq y \leq 1$, and $x+y \leq 1$, said second semiconductor layer being formed on said buffer layer.

* * * * *